United States Patent
Pu

(10) Patent No.: US 7,023,085 B2
(45) Date of Patent: Apr. 4, 2006

(54) SEMICONDUCTOR PACKAGE STRUCTURE WITH REDUCED PARASITE CAPACITANCE AND METHOD OF FABRICATING THE SAME

(75) Inventor: Han-Ping Pu, Taichung (TW)

(73) Assignee: Siliconware Precision Industries Co., Ltd, (TW)

(*) Notice: Subject to any disclaimer, the term of this patent is extended or adjusted under 35 U.S.C. 154(b) by 0 days.

(21) Appl. No.: 10/921,582

(22) Filed: Aug. 18, 2004

(65) Prior Publication Data

US 2005/0212134 A1 Sep. 29, 2005

(30) Foreign Application Priority Data

Mar. 29, 2004 (TW) ............................... 93108474 A

(51) Int. Cl.
*H01L 23/34* (2006.01)

(52) U.S. Cl. .................. 257/724; 257/924; 257/778; 257/691; 257/786; 438/108; 438/171

(58) Field of Classification Search ................ 257/723, 257/724, 691, 737, 738, 786, 924; 438/108, 438/171
See application file for complete search history.

(56) References Cited

U.S. PATENT DOCUMENTS

2004/0067605 A1* 4/2004 Koizumi ...................... 438/108
2005/0007129 A1* 1/2005 Pu .............................. 324/754

* cited by examiner

*Primary Examiner*—Jasmine Clark
(74) *Attorney, Agent, or Firm*—Peter F. Corless; Steven M. Jensen; Edwards Angell Palmer & Dodge LLP

(57) ABSTRACT

A semiconductor package structure for improving electrical performance and a method for fabricating the same are proposed, in which a substrate having at least one pair of passive component pads is provided, wherein a semiconductor chip is attached on the substrate and a passive component is mounted to the passive component pads to locate between the substrate and the semiconductor chip. Thus, the passive component can electrically connect the chip and the substrate simultaneously without arranging an additional conductive trace layer, thereby improving the electrical performance of the semiconductor package structure and reducing the structure size.

10 Claims, 3 Drawing Sheets

SEMICONDUCTOR PACKAGE STRUCTURE WITH REDUCED PARASITE CAPACITANCE AND METHOD OF FABRICATING THE SAME

BACKGROUND OF THE INVENTION

1. Field of the Invention

This invention relates to semiconductor packaging technology, and more particularly, to a semiconductor package structure with reduced parasite capacitance and method of fabricating the same, which is designed for the fabrication of a flip-chip (FC) type of semiconductor package, and which features the reduction of parasite capacitance in the package structure for ensured electrical performance during actual operation of the packaged integrated circuitry, and also allows the overall package body to be made more compact in size.

2. Description of Related Art

FC (Flip-Chip) is a more advanced type of semiconductor packaging technology which is characterized by that the semiconductor chip is mounted in an upside-down (i.e., flip chip) manner over the substrate and bonded to the same by means of solder bumps. Further, the flip chip is electrically connected to solder balls (i.e., ball grid array, BGA) implanted on the back side of the substrate for electrical connections to a printed circuit board (PCB). Since flip-chip package can be fabricated without the use of bonding wires, it allows the overall package body to be made more compact in size.

FIG. 1 is a schematic diagram showing a sectional view of a conventional flip-chip package structure. As shown, the flip-chip package structure includes a substrate 10, a passive component 20, and a semiconductor chip 30; wherein the substrate 10 has a front surface 10a and a back surface 10b, and whose front surface 10a is formed with a plurality of pads, including at least a pair of passive-component pads 11, 12 and a group of signal pads 13, where the passive-component pads 11, 12 are used for ground/power connections with the passive component 20 and the signal pads 13 are used for signal connections. Moreover, these pads 11, 12, 13 extend from the front surface 10a to the back surface 10b of the substrate 10 through electrically-conductive vias ((not shown) for electrical connection to solder balls 15 on the back surface 10b of the substrate 10. The passive component 20 can be either a resistor or a capacitor, and which has two connecting ends: a first connecting end 21 and a second connecting end 22 respectively bonded to the passive-component pads 11, 12. The chip 30 has an active surface 30a and an inactive surface 30b, where the active surface 30a is defined with a plurality of ground/power pads 31, 32 and a plurality of signal pads 33. Moreover, the chip 130 is formed with a plurality of solder bumps 40 for electrically connecting the signal pads 33 and the ground/power pads 31, 32 to corresponding pads 13 on the front surface 10a of the substrate 10 to form a flip-chip package structure. In this flip-chip package structure, the electrical connections with external circuitry are conducted through the vias for signal transmission, grounding, and power supply, and the passive component 20 is electrically connected to the chip 30 by connecting the ground/power pads 31, 32 by way of vias (not shown) or electrically-conductive traces 14 to the passive-component pads 11, 12.

One drawback to the forgoing package structure, however, is that the long length of traces 14 that are interconnected between the passive component 20 and the chip 30 would easily cause parasite capacitance that would adversely degrade the electrical performance of the packaged chip 30 during high-frequency operation. Moreover, since the passive component 20 is mounted outside the die-mounting area on the substrate 10, it requires the use of a large-area substrate for the mounting of the passive component 20 and the chip 30, undesirably making the overall package body unsatisfactorily large.

SUMMARY OF THE INVENTION

It is therefore an objective of this invention to provide a new semiconductor fabrication technology that can help reduce the parasite capacitance in a flip-chip package structure to ensure the electrical performance of the packaged chip during actual operation.

It is another objective of this invention to provide a new semiconductor fabrication technology that can help make the overall package body to be more compact in size.

The semiconductor fabrication technology according to the invention is characterized by the arrangement of the passive component directly beneath the packaged chip and the direct electrical connection of the passive component 120 with the substrate and the chip, without the provision of electrically-conductive traces that extend beyond the packaged chip. This feature allows the reduction of parasite capacitance in the semiconductor package that can help ensure the electrical performance of the packaged chip during actual operation, as well as allow the overall package body to be made more compact in size compared to the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The semiconductor packaging technology with reduced parasite capacitance according to the invention is disclosed in full details by way of preferred embodiments in the following with reference to FIGS. 2A–2D (Note that FIGS. 2A–2D are simplified schematic diagrams showing the fundamental package structure according to the invention whose components are not shown in actual number, shape, and scale; the actual layout on the package may be much more complex in practical applications).

Figure 2A:
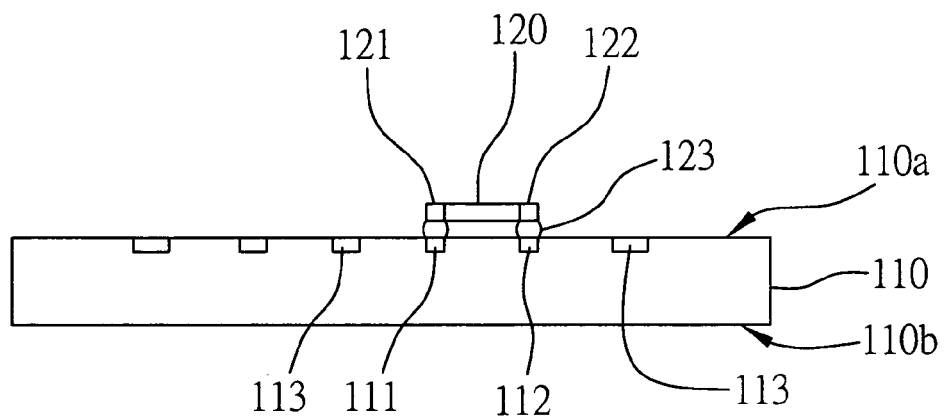
FIG. 2A is a schematic sectional diagram used to depict a first procedural step in the flip-chip package fabrication technology according to the invention.

Referring first to FIG. 2A, in the fabrication process according to the semiconductor packaging technology of the invention, the initial step is to prepare a substrate 110 and a passive component 120 (note that in this embodiment, only one passive component is used; however, it is to be noted that in actual applications, the number of passive components can be an arbitrary design choice).

The substrate 110 is a flat plate made of an electrically-insulating material, which has a front surface 110a and a back surface 110b, and whose front surface 110a is formed with a plurality of pads, including a pair of passive-component pads 111, 112 and a group of signal pads 113, where the passive-component pads 111, 112 are used for ground/power connections with the passive component 120 and the signal pads 113 are used for signal connections. Moreover, these pads 111, 112, 113 extend from the front surface 110a to the back surface 110b of the substrate 110 through electrically-conductive vias (not shown) for connection to solder balls (not shown) that are to be implanted on the back surface 110b. Alternatively, in other design, the substrate 110 can be a multi-layer structure in which the passive-component pads 111, 112 are connected to a corresponding ground/power layer (not shown) in the substrate 110.

Figure 1:
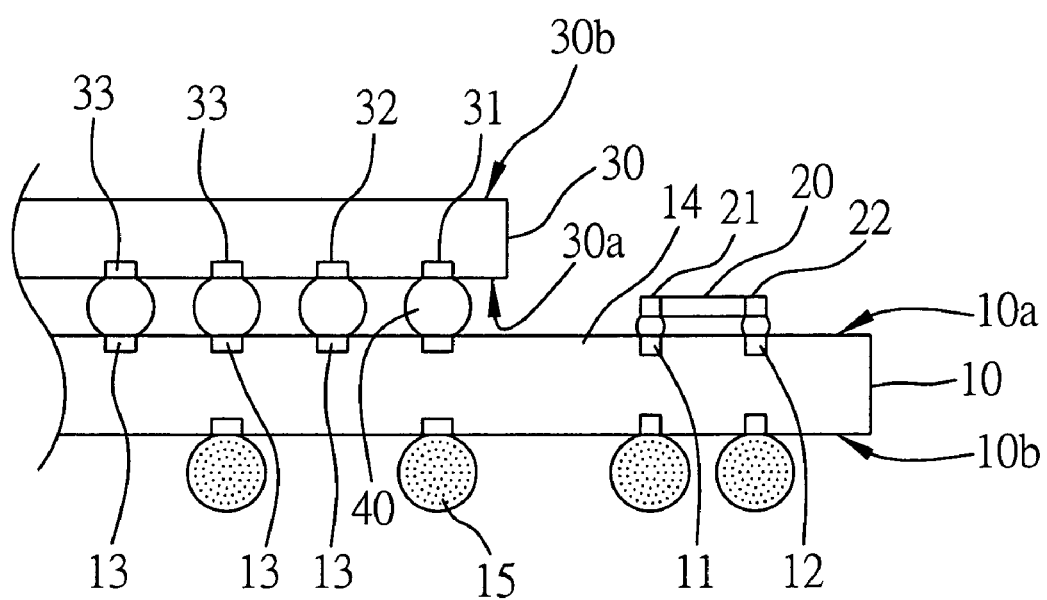
FIG. 1 is a schematic diagram showing a sectional view of a conventional flip-chip package structure.

The key feature of the semiconductor fabrication technology according to the invention is that the passive-component pads 111, 112 are located within the die-mounting area (i.e., the area where the chip 130 is to be mounted), and not outside the die-mounting area as in the case of the prior art of FIG. 1.

Figure 2B:
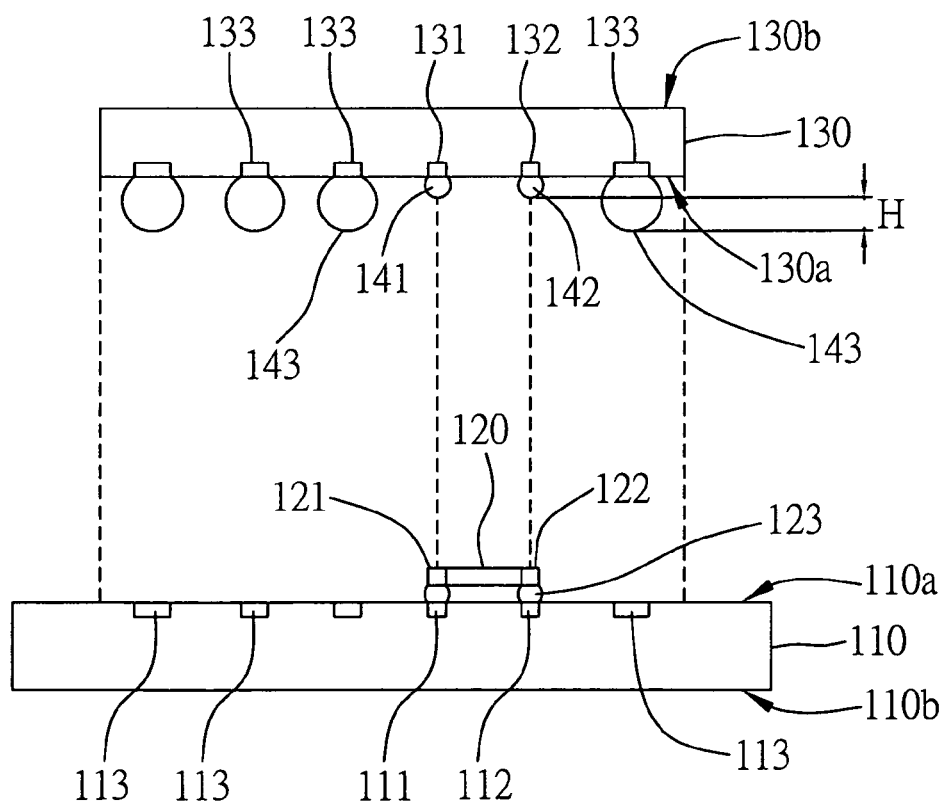
FIG. 2B is a schematic sectional diagram used to depict a second procedural step in the flip-chip package fabrication technology according to the invention.

The passive component 120 can be either a resistor or a capacitor, which has two connecting ends: a first connecting end 121 and a second connecting end 122; and as shown in FIG. 2B, the chip 130 has an active surface 130a and an inactive surface 130b, where the active surface 130a is defined with a ground pad 131 and a power pad 132 corresponding respectively to the first connecting end 121 and the second connecting end 122 of the passive component 120. Moreover, the active surface 130a of the chip 130 is formed with a plurality of signal pads 133 corresponding to the signal pads 113 on the substrate 110. Furthermore, the chip 130 is formed with a plurality of bumps 141, 142, 143 having different height through a bumping process utilizing screen-printing or electroplating technology. The first-type bumps 141, 142 on the ground pad 131 and the power pad 132 are lower in height, whereas the second-type bumps 143 on the signal pads 133.

As shown in FIG. 2A, in packaging process, the first step is to mount the passive component 120 onto the front surface 110a of the substrate 110, in such a manner that the first connecting end 121 and the second connecting end 122 of the passive component 120 are bonded by means of solder 123 to the corresponding passive-component pads 111, 112 on the front surface 110a of the substrate 110.

Figure 2C:
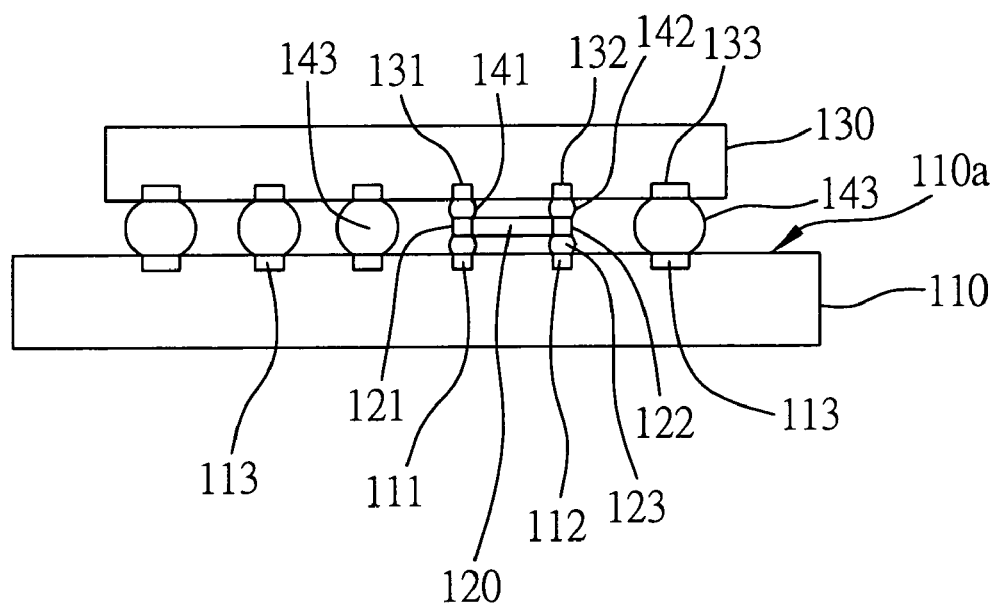
FIG. 2C is a schematic sectional diagram used to depict a third procedural step in the flip-chip package fabrication technology according to the invention.

Subsequently, as shown in FIGS. 2B and 2C, in the next step, the chip 130 is mounted in a flip-chip manner onto the front surface 110a of the substrate 110, in such a manner that the shorter first-type bumps 141, 142 on the ground pad 131 and power pad 132 on the chip 130 are aligned to the first connecting end 121 and the second connecting end 122 of the passive component 120, and the larger second-type bumps 143 on the signal pads 133 are aligned to the signal pads 113 on the front surface 110a of the substrate 110, whereby the ground pad 131 and the power pad 132 are electrically connected by means of the first-type bumps 141, 142 to the first connecting end 121 and the second connecting end 122 of the passive component 120, while the signal pads 133 on the chip 130 are electrically connected by means of the second-type bumps 143 to the signal pads 113 for signal transmission. This completes the mounting of the chip 130.

Figure 2D:
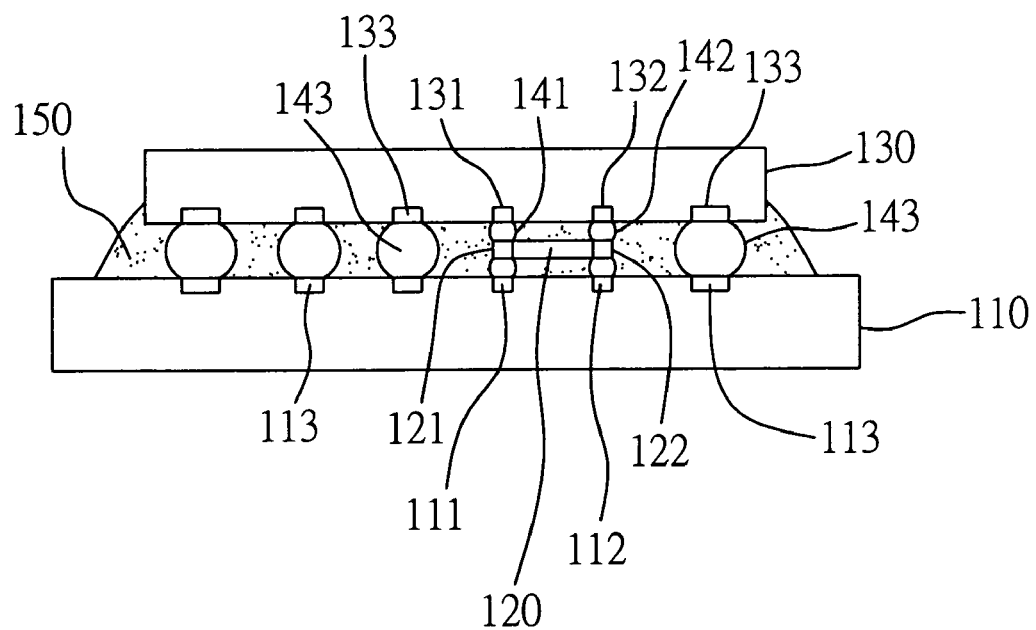
FIG. 2D is a schematic sectional diagram used to depict a fourth procedural step in the flip-chip package fabrication technology according to the invention.

Referring next to FIG. 2D, in the subsequent step, a flip chip underfill process is performed to form a flip-chip underfill layer 150 in the gap between the substrate 110 and the chip 130. The flip-chip underfill layer 150 extends to the outside of the chip 130 to form an encapsulation body. Since the flip-chip underfill is a conventional technology, detailed description thereof will not be given in this specification. Subsequent steps include solder ball implantation on the back surface 110b of the substrate 110. However, since all these subsequent steps utilize conventional processes and not within the spirit and scope of the invention, detailed description thereof will not be given in this specification.

In the fabricated flip-chip package by the invention, refer to FIG. 2C, since the passive component 120 is arranged in the gap between the substrate 110 and the chip 130 and electrically interconnected with the substrate 110 and the chip 130 by means of solder 123 and bumps 141, 142, it eliminate the use of electrically-conductive traces and therefore can help reduce parasite capacitance, allowing the packaged chip 130 to have ensured electrical performance during high-frequency operation. Moreover, since the passive component 120 is located outside the die-mounting area, and not within the die-mounting area as in the case of the prior art of FIG. 1, it allows the use of a smaller substrate 110 for mounting the chip 130 and the passive component 120, making the overall package body more compact in size compared to the prior art.

In conclusion, the invention provides a semiconductor package structure with reduced parasite capacitance and method of fabricating the same, which is used for the fabrication of a flip-chip package structure, and which is characterized by the arrangement of the passive component directly beneath the packaged chip and the direct electrical connection of the passive component 120 with the substrate and the chip, without the provision of electrically-conductive traces that extend beyond the packaged chip. This feature allows the reduction of parasite capacitance in the semiconductor package that can help ensure the electrical performance of the packaged chip during actual operation, as well as allow the overall package body to be made more compact in size compared to the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package with reduced parasite capacitance, comprising:

preparing a substrate, which is predefined with at least a pair of passive-component pads and a plurality of signal pads;

preparing a passive component having a first connecting end and a second connecting end;

preparing a semiconductor chip, which has an active surface and an inactive surface, and whose active surface is formed with at least a pair of ground/power pads and a plurality of signal pads, wherein a plurality of first-type bumps and second-type bumps are formed through a bumping process respectively over the ground/power pads and the signal pads, where the first-type bumps are smaller in height than the second-type bumps;

bonding the first connecting end and the second connecting end of the passive component to the passive-component pads on the substrate;

mounting the semiconductor chip onto the substrate, wherein the first-type bumps are bonded to the first connecting end and the second connecting end of the passive component while the second-type bumps are bonded to the signal pads on the substrate; and performing a flip-chip underfill process to form a flip-chip underfill layer in the gap between the chip and the substrate for serving as an encapsulation body.

2. The method of claim 1, wherein the passive component is a resistor.

3. The method of claim 1, wherein the passive component is a capacitor.

4. The method of claim 1, wherein the bumping process utilizes screen-printing technology.

5. The method of claim 1, wherein the bumping process utilizes electroplating technology.

6. A semiconductor package structure with reduced parasite capacitance, which comprises:

a substrate, which is predefined with at least a pair of passive-component pads and a plurality of signal pads;

a passive component, which has a first connecting end and a second connecting end respectively electrically connected to the passive-component pads on the substrate;

a semiconductor chip, which has an active surface and an inactive surface, and whose active surface is formed with at least a pair of ground/power pads and a plurality of signal pads, wherein a plurality of first-type bumps and second-type bumps are formed through a bumping process respectively over the ground/power pads and the signal pads, where the first-type bumps are smaller in height than the second-type bumps, and the first-type bumps are bonded to the first connecting end and the second connecting end of the passive component while the second-type bumps are bonded to the signal pads on the substrate; and a flip-chip underfill layer, which is formed in the gap between the chip and the substrate for serving as an encapsulation body.

7. The semiconductor package structure of claim 6, wherein the passive component is a resistor.

8. The semiconductor package structure of claim 6, wherein the passive component is a capacitor.

9. The semiconductor package structure of claim 6, wherein the bumping process utilizes screen-printing technology.

10. The semiconductor package structure of claim 6, wherein the bumping process utilizes electroplating technology.

* * * * *